United States Patent
Lin et al.

(10) Patent No.: US 9,659,886 B2
(45) Date of Patent: May 23, 2017

(54) METHOD OF FABRICATING SEMICONDUCTOR DEVICE HAVING VOIDS BETWEEN TOP METAL LAYERS OF METAL INTERCONNECTS

(71) Applicant: NANYA TECHNOLOGY CORPORATION, Taoyuan (TW)

(72) Inventors: Chung-Hsin Lin, New Taipei (TW); Ping-Heng Wu, Taoyuan County (TW); Chao-Wen Lay, Miaoli County (TW); Hung-Mo Wu, New Taipei (TW); Ying-Cheng Chuang, Taoyuan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/193,117

(22) Filed: Jun. 27, 2016

(65) Prior Publication Data
US 2016/0307859 A1    Oct. 20, 2016

Related U.S. Application Data

(62) Division of application No. 14/028,554, filed on Sep. 17, 2013, now Pat. No. 9,418,949.

(51) Int. Cl.
*H01L 23/528* (2006.01)
*H01L 23/532* (2006.01)
(Continued)

(52) U.S. Cl.
CPC ............ *H01L 24/05* (2013.01); *H01L 23/522* (2013.01); *H01L 24/03* (2013.01);
(Continued)

(58) Field of Classification Search
CPC ....... H01L 24/05; H01L 23/522; H01L 24/03; H01L 23/525; H01L 2924/3512;
(Continued)

(56) References Cited

U.S. PATENT DOCUMENTS 6,303,464 B1* 10/2001 Gaw .................. H01L 21/7682
438/422
6,940,146 B2 9/2005 Lee et al.
(Continued)

FOREIGN PATENT DOCUMENTS

CN        1645583        7/2005

OTHER PUBLICATIONS

"Office Action of China Counterpart Application", issued on Sep. 27, 2016, p. 1-p. 10.

*Primary Examiner* — Marcos D Pizarro
*Assistant Examiner* — Nelson Garces
(74) *Attorney, Agent, or Firm* — Jianq Chyun IP Office

(57) ABSTRACT

The invention provides a semiconductor device including a substrate, a dielectric layer, a dummy bonding pad, a bonding pad, a redistribution layer, and a metal interconnect. The substrate includes a non-device region and a device region. The dielectric layer is on the non-device region and the device region. The dummy bonding pad is on the dielectric layer of the non-device region. The metal interconnect is in the dielectric layer of the non-device region and connected to the dummy bonding pad. The bonding pad is on the dielectric layer of the device region. The buffer layer is between the bonding pad and the dielectric layer. The buffer layer includes metal, metal nitride, or a combination thereof. The redistribution layer is on the dielectric layer and connects the dummy bonding pad and the bonding pad.

7 Claims, 6 Drawing Sheets

(51) Int. Cl.
*H01L 23/52* (2006.01)
*H01L 21/4763* (2006.01)
*H01L 23/48* (2006.01)
*H01L 23/00* (2006.01)
*H01L 23/522* (2006.01)
*H01L 23/31* (2006.01)
*H01L 23/525* (2006.01)

(52) U.S. Cl.
CPC ........ *H01L 23/3192* (2013.01); *H01L 23/525* (2013.01); *H01L 23/562* (2013.01); *H01L 24/48* (2013.01); *H01L 2224/0218* (2013.01); *H01L 2224/0219* (2013.01); *H01L 2224/036* (2013.01); *H01L 2224/0345* (2013.01); *H01L 2224/0361* (2013.01); *H01L 2224/03614* (2013.01); *H01L 2224/03622* (2013.01); *H01L 2224/04042* (2013.01); *H01L 2224/05025* (2013.01); *H01L 2224/05082* (2013.01); *H01L 2224/05124* (2013.01); *H01L 2224/05147* (2013.01); *H01L 2224/05548* (2013.01); *H01L 2224/05554* (2013.01); *H01L 2224/05567* (2013.01); *H01L 2224/05624* (2013.01); *H01L 2224/05647* (2013.01); *H01L 2224/48463* (2013.01); *H01L 2924/00014* (2013.01); *H01L 2924/01073* (2013.01); *H01L 2924/01074* (2013.01); *H01L 2924/04953* (2013.01); *H01L 2924/3512* (2013.01); *H01L 2924/35121* (2013.01)

(58) Field of Classification Search
CPC . H01L 2924/35121; H01L 2224/05567; H01L 2224/04042; H01L 2224/0345; H01L 2224/03622; H01L 23/3192; H01L 2224/0361; H01L 23/562; H01L 24/48; H01L 2924/00; H01L 2224/73265; H01L 2224/48227; H01L 2224/73204; H01L 2924/15311; H01L 2224/0239; H01L 2224/97; H01L 2224/73215; H01L 2225/06513; H01L 2224/0401; H01L 24/97; H01L 25/0655; H01L 24/83; H01L 2225/107
USPC .................................................... 257/720–790
See application file for complete search history.

(56) References Cited

U.S. PATENT DOCUMENTS

| | | | | |
|---|---|---|---|---|
| 7,629,689 | B2* | 12/2009 | Maeda | H01L 22/32 257/758 |
| 2001/0051423 | A1* | 12/2001 | Kim | H01L 21/7682 438/624 |
| 2005/0121804 | A1* | 6/2005 | Kuo | H01L 22/32 257/781 |
| 2009/0079083 | A1* | 3/2009 | Yang | H01L 21/7682 257/773 |
| 2009/0115061 | A1* | 5/2009 | Chen | H01L 21/76807 257/751 |

* cited by examiner

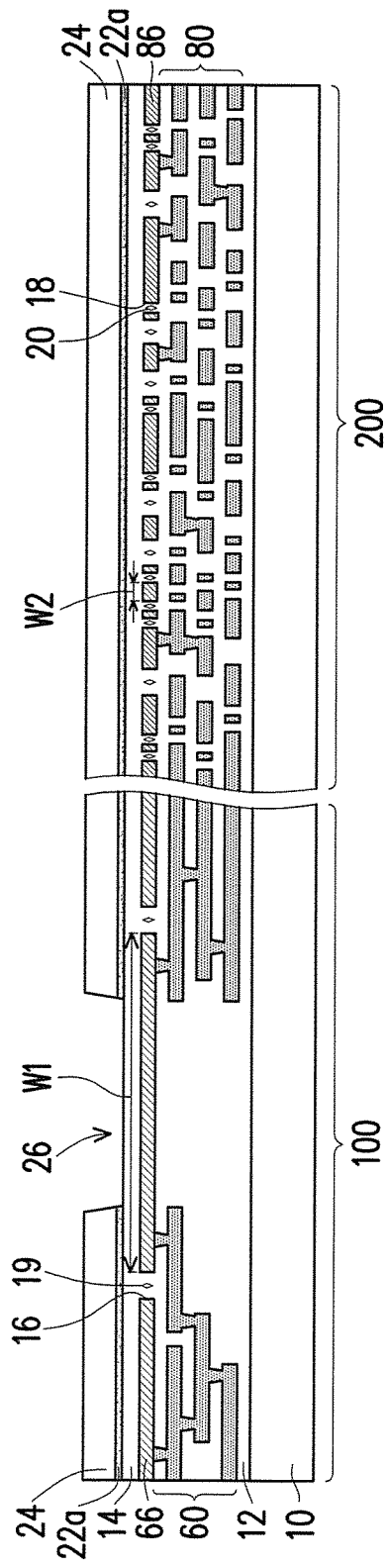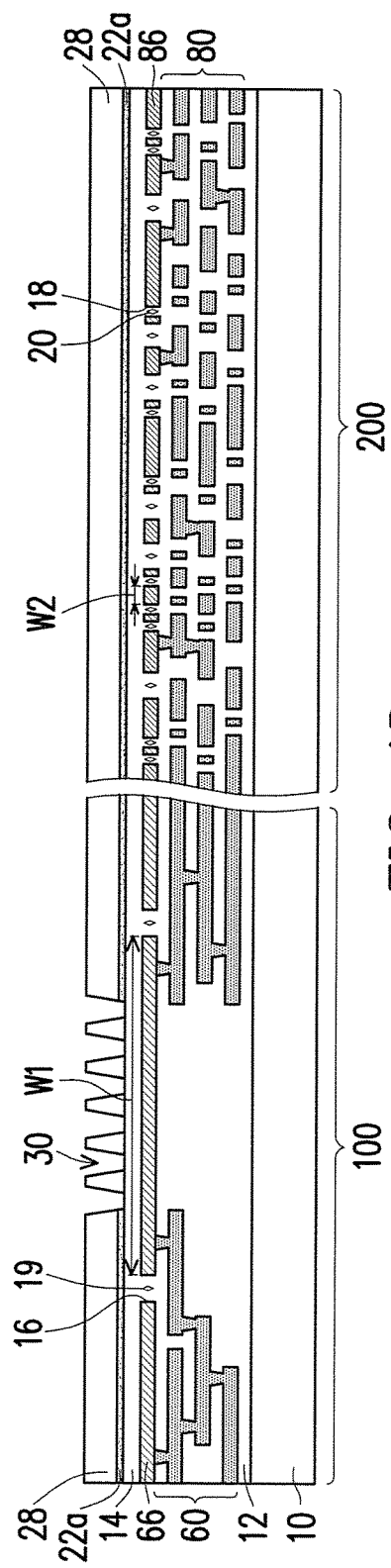
FIG. 1C
FIG. 1D

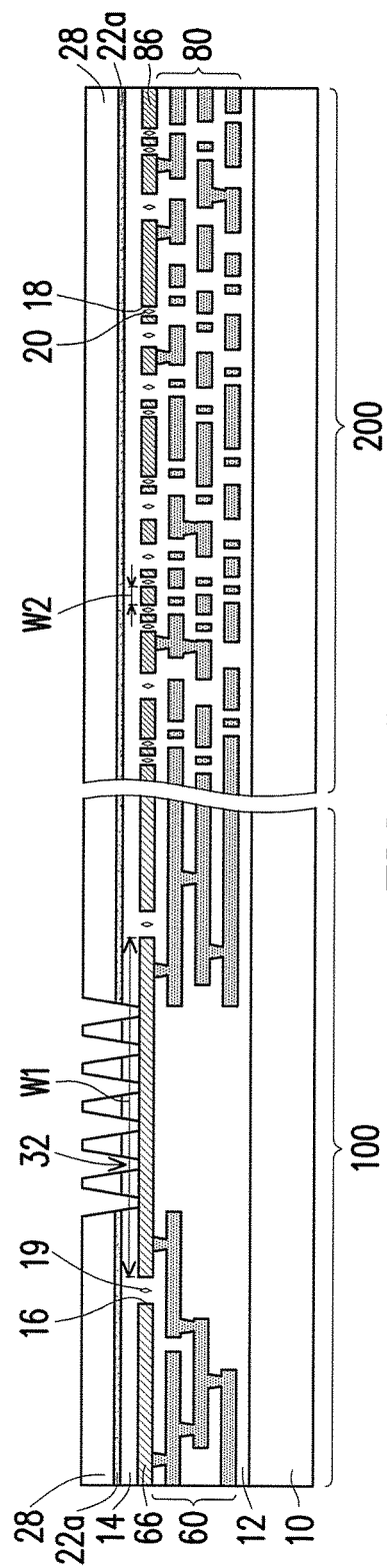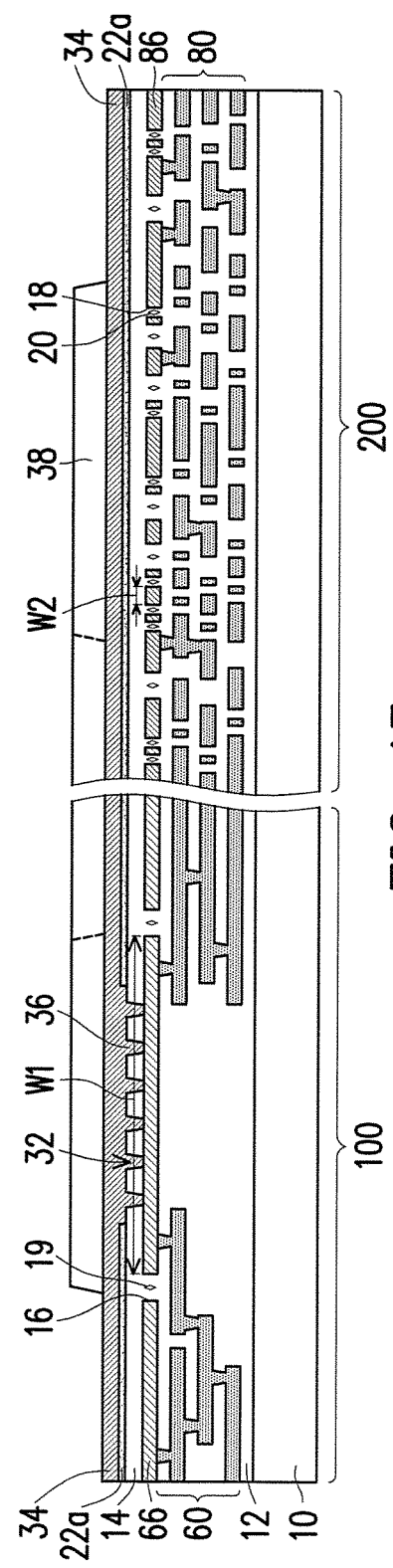
FIG. 1E
FIG. 1F

METHOD OF FABRICATING SEMICONDUCTOR DEVICE HAVING VOIDS BETWEEN TOP METAL LAYERS OF METAL INTERCONNECTS

CROSS-REFERENCE TO RELATED APPLICATION

This application is a divisional application of and claims the priority benefit of a prior application Ser. No. 14/028,554, filed on Sep. 17, 2013, now allowed. The entirety of the above-mentioned patent application is hereby incorporated by reference herein and made a part of this specification.

BACKGROUND OF THE INVENTION

Field of the Invention

The invention relates to a semiconductor device and a method of fabricating the same.

Description of Related Art

With the development of the semiconductor process, the integrated circuit (IC) device is becoming highly integrated. In the packaging process of the semiconductor device, the integrated circuit packaging plays an important role. The type of the integrated circuit packaging can contain, for instance, wire bonding packaging (WB), tape automatic bonding (TAB), and flip chip (FC).

Bonding force needs to be provided in the packaging process and the region below the contact (the bonding pad) needs to withstand a relatively large impact energy. As a result, cracks, peeling, or deformation to the dielectric layer below a bonding pad can occur, and thereby causing damage to the chip.

SUMMARY OF THE INVENTION

The invention provides a semiconductor device and a method of fabricating the same. The semiconductor device and the method of fabricating the same can prevent the generation of cracks, peeling, or deformation to the dielectric layer below a bonding pad.

The invention provides a semiconductor device. The semiconductor device includes a substrate, a dielectric layer, a dummy bonding pad, a bonding pad, a redistribution layer, and a metal interconnect. The substrate includes a non-device region and a device region. The dielectric layer is on the non-device region and the device region. The dummy bonding pad is on the dielectric layer of the non-device region. The metal interconnect is in the dielectric layer of the non-device region and connected to the dummy bonding pad. The bonding pad is on the dielectric layer of the device region. The buffer layer is between the bonding pad and the dielectric layer. The buffer layer includes metal, metal nitride, or a combination thereof. The redistribution layer is on the dielectric layer and connects the dummy bonding pad and the bonding pad.

The invention provides a method of fabricating a semiconductor device. The method of fabricating a semiconductor device includes providing a substrate, wherein the substrate includes a non-device region and a device region. A dielectric layer is formed on the non-device region and the device region. A metal interconnect is formed in the dielectric layer of the non-device region. A buffer layer is formed on the dielectric layer of the device region. The buffer layer includes metal, metal nitride, or a combination thereof. A conductive layer is formed on the dielectric layer. The conductive layer is patterned to form a dummy bonding pad, a bonding pad, and a redistribution layer. The dummy bonding pad is on the non-device region and electrically connected to the metal interconnect. The bonding pad is on the buffer layer of the device region. The redistribution layer connects the dummy bonding pad and the bonding pad.

The semiconductor device and the method of fabricating the same of the embodiments of the invention can prevent the generation of cracks, peeling, or deformation to the dielectric layer below a bonding pad.

The semiconductor device and the method of fabricating the same of the embodiments of the invention can form the bonding pad and the redistribution layer at the same time, and therefore additional steps are not needed.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1I are cross-sectional flowcharts of a method of fabricating a semiconductor device illustrated according to an embodiment of the invention.

DESCRIPTION OF THE EMBODIMENTS

Figure 1A:
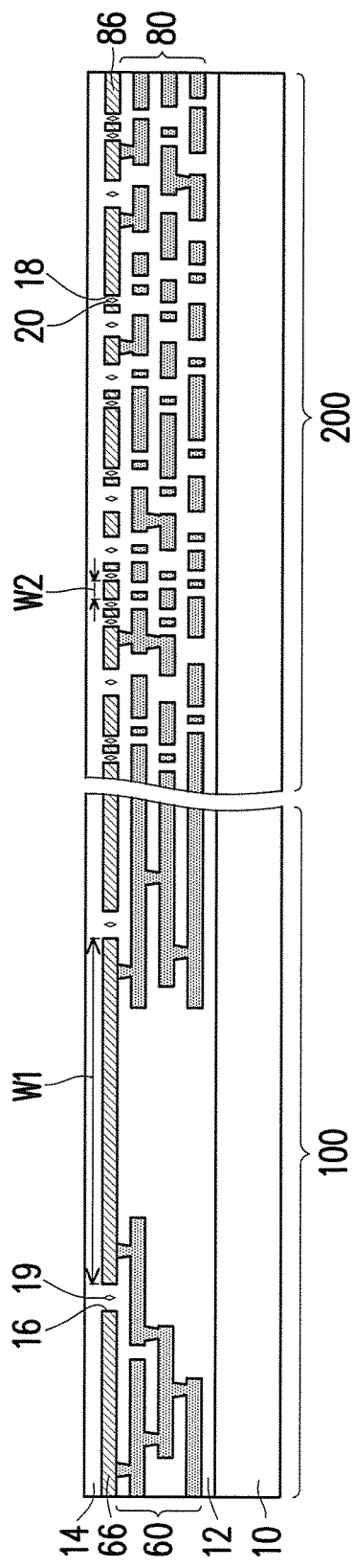
Figure 1B:
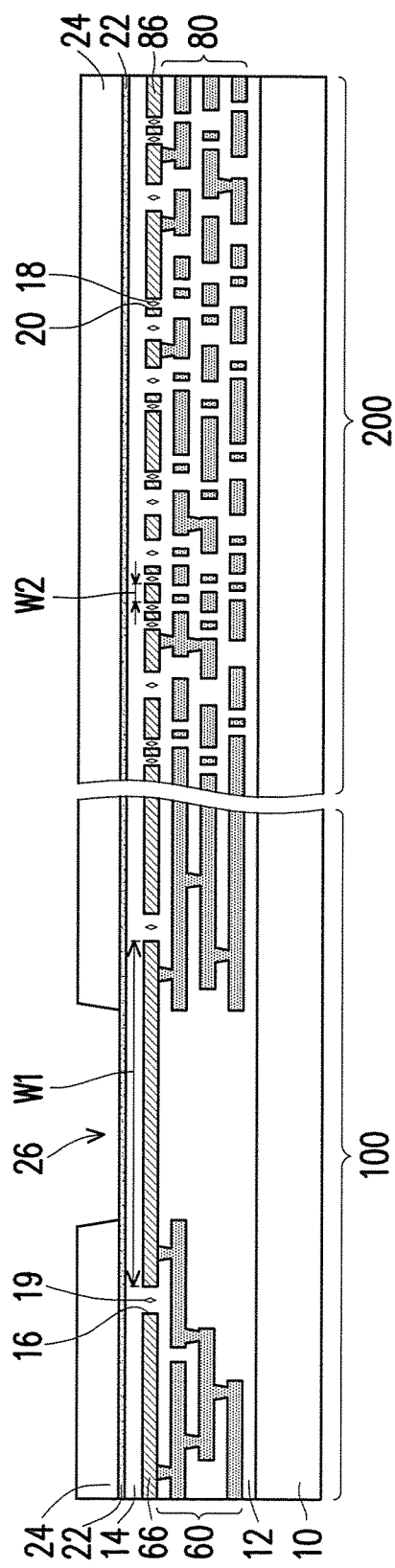
Figure 1G:
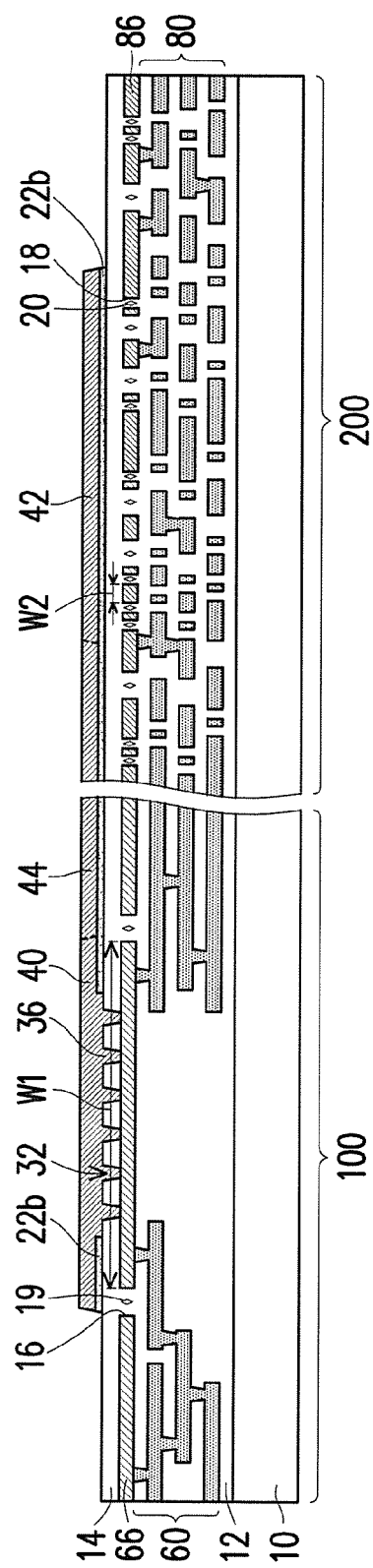
Figure 2:
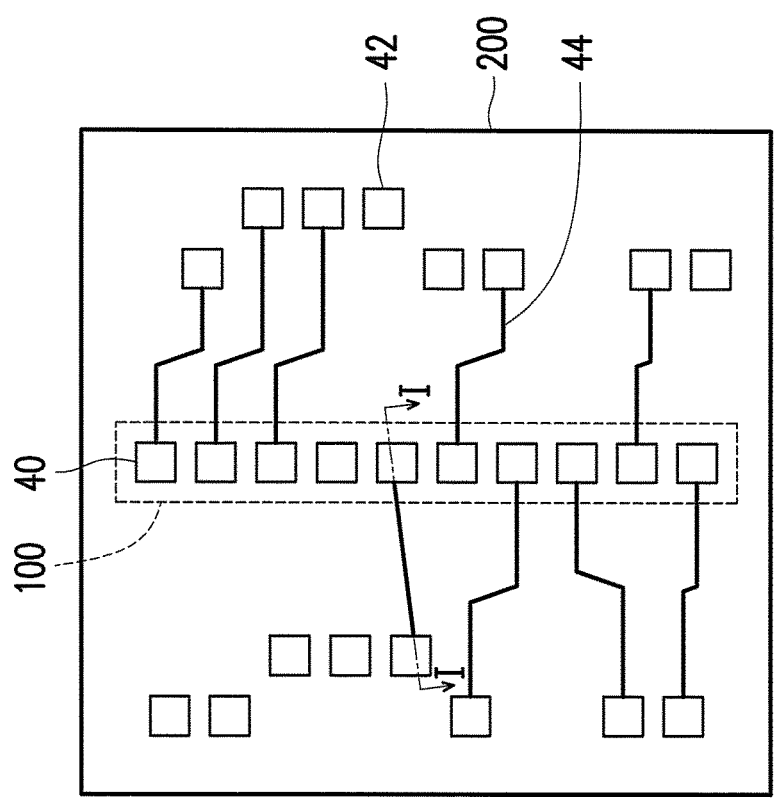
FIG. 2 is a top view of FIG. 1G.

FIG. 2 is a top view of a semiconductor device illustrated according to an embodiment of the invention. FIG. 1G is a cross-sectional diagram along line I-I in FIG. 2.

Figure 1H:
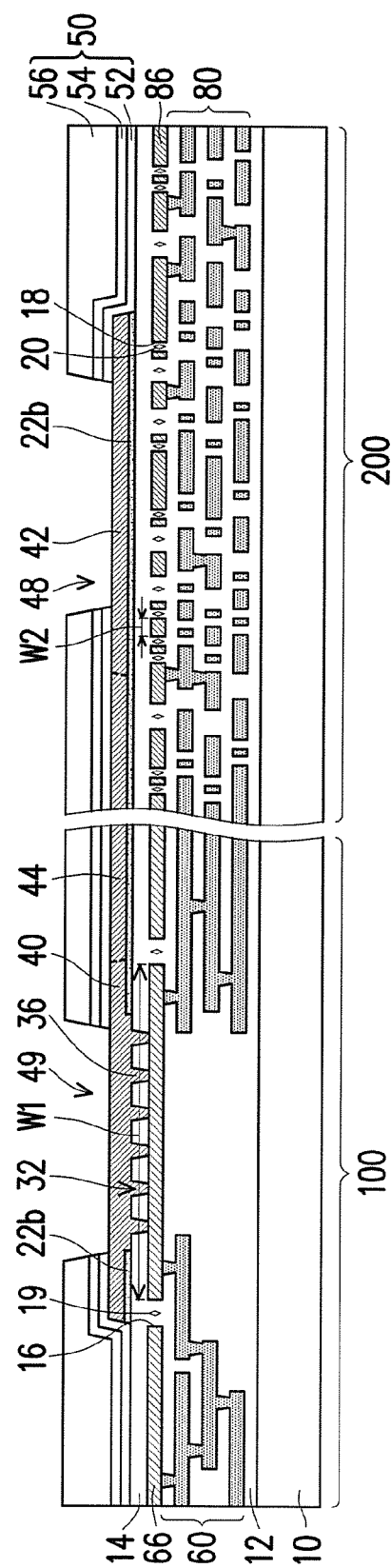
Figure 1I:
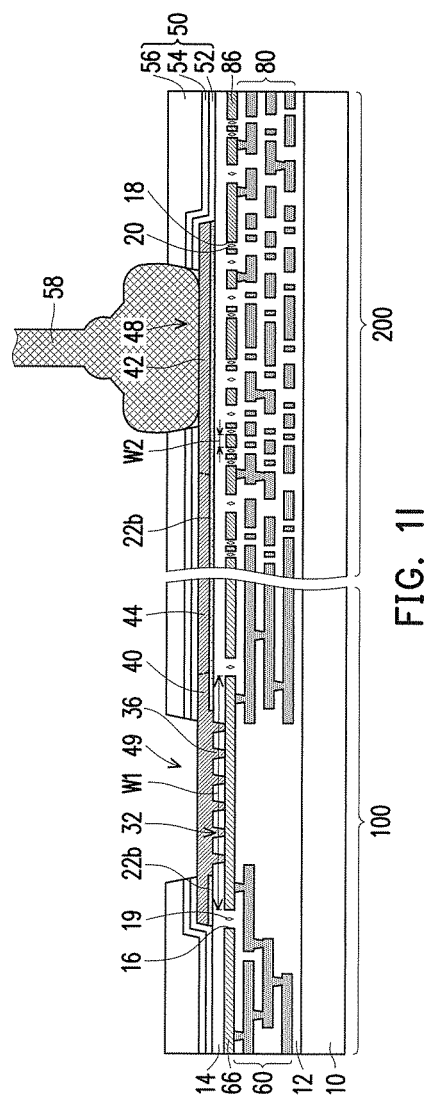

Referring to FIG. 1I and FIG. 2, in the semiconductor device of the invention, a bonding pad 42 is disposed on a device region 200 and a dummy bonding pad 40 is disposed on a non-device region 100. The bonding pad 42 is directly electrically connected to the dummy bonding pad 40 through a redistribution layer (RDL) 44 on the same layer to be electrically connected to a first metal interconnect 60 below the dummy bonding pad 40. Since bonding wires are formed on the bonding pad 42 of the device region 200, and the dummy bonding pad 40 of the non-device region 100 is covered by a protective layer 50 and therefore has no bonding wire formation, issues generated by bonding process do not occur on the dielectric layer 14 of the non-device region 100. Moreover, a buffer layer 22b is disposed below the bonding pad 42 on the device region 200, thereby improving issues such as peeling, cracks, or deformation of the dielectric layer 14 on the device region 200 due to bonding process.

Referring to FIG. 1I and FIG. 2, more specifically, the semiconductor device of the invention includes a substrate 10, dielectric layers 12 and 14, a dummy bonding pad 40, a first metal interconnect 60, a bonding pad 42, a buffer layer 22b, a second metal interconnect 80, a redistribution layer 44, and a protective layer 50.

The substrate 10 includes a non-device region 100 and a device region 200. In the present embodiment, the non-device region 100 can be a region where have no semiconductor device such as a transistor formed under the first metal interconnect 60. In an embodiment, an array, a core circuit, or a periphery circuit is not formed in the non-device region 100. The device region 200 represents the region that is not the non-device region 100. The device region 200 can be a core circuit region, a periphery circuit region or an array region. The array region is, for instance, a switch array region, a memory array region, a logic array region, a capacitor array region, a resistor array region, or an inductor array region, but is not limited thereto. In an embodiment, referring to FIG. 2, the non-device region 100 can be in a probe pad region, an edge pad region or a central pad region of the device region 200, but the invention is not limited thereto. In another embodiment, the non-device region 100 and the device region 200 can be separated by a distance.

The dielectric layer 14 is on the non-device region 100 and the device region 200 of the substrate 10. The dummy bonding pad 40 is on the dielectric layer 14 of the non-device region 100. The dummy bonding pad 42 is on the dielectric layer 14 of the device region 200. The buffer layer 22b is between the bonding pad 42 and the dielectric layer 14. The buffer layer 22b can be further between the dummy bonding pad 40 and the dielectric layer 14. The buffer layer 22b includes metal, metal nitride, or a combination thereof. The material of the buffer layer 22b includes, for instance, tungsten, tantalum, tantalum/tantalum nitride/tantalum, or a combination thereof. The thickness of the buffer layer 22b is, for instance, 300 angstroms to 5000 angstroms.

The redistribution layer 44 is on the dielectric layer 14 and connects the dummy bonding pad 40 on the non-device region 100 and the bonding pad 42 on the device region 200. The redistribution layer 44, the bonding pad 42, and the dummy bonding pad 40 are all on the dielectric layer 14 and are formed by patterning the same metal layer. Therefore, the height of each of the redistribution layer 44, the bonding pad 42, and the dummy bonding pad 40 is substantially the same.

The first metal interconnect 60 is in the dielectric layers 12 and 14 of the non-device region 100 and connected to the dummy bonding pad 40 above. The second metal interconnect 80 is in the dielectric layers 12 and 14 below the bonding pad 42 of the device region 200, and the second metal interconnect 80 is not connected to the bonding pad 42. The first metal interconnect 60 includes a plurality of first top metal layers 66, the second metal interconnect 80 includes a plurality of second top metal layers 86, wherein the linewidth W1 of at least one of the first top metal layers 66 is greater than the linewidth W2 of one of the second top metal layers 86. The dielectric layer 14 cannot completely fill gaps 16 between the first top metal layers 66 and gaps 18 between the second top metal layers 86, thereby forming voids 19 and 20 in the gaps 16 and 18. Since the linewidth W1 of each of the first top metal layers 66 on the non-device region 100 is greater than the linewidth W2 of each of the second top metal layers 86 on the device region 200, the number of the voids 20 of the non-device region 100 in a unit area is less than the number of the voids 19 of the device region 200 in a unit area.

Moreover, the first metal interconnect 60 further includes a plurality of vias (or a single via) 36 in the dielectric layer 14, wherein the vias 36 connect the first top metal layers 66 and the dummy bonding pad 40, and no vias are connected to the bonding pad 42 on the second top metal layers 86 of the second metal interconnect 80.

The protective layer 50 covers the dummy bonding pad 40, the redistribution layer 44, and a portion of the bonding pad 42 of the non-device region, and the protective layer 50 has a pad window 48 exposing the surface of the bonding pad 42 and a pad window 49 exposing the surface of the dummy bonding pad 40. A bonding wire 58 is formed on the bonding pad 42.

FIGS. 1A to 1I are cross-sectional flowcharts of a method of fabricating a semiconductor device illustrated according to an embodiment of the invention. FIG. 2 is a top view of FIG. 1G.

Referring to FIG. 1A, a substrate 10 is provided. The substrate 10 includes a non-device region 100 and a device region 200. The substrate 10 can include a semiconductor material, an insulating material, a conductive material, or any combination of the materials and the substrate 10 includes a single-layer structure or a multi-layer structure. For instance, the substrate 10 can be formed by at least one semiconductor material selected from the group consisting of Si, Ge, SiGe, GaP, GaAs, SiC, SiGeC, InAs, and InP. Moreover, a silicon on insulator (SOI) substrate can also be used. The substrate 10 can be formed by a multi-layer material, such as Si/SiGe or Si/SiC. The material of the substrate 10 is not limited thereto.

Then, referring further to FIG. 1A, the dielectric layer 12 is formed on the non-device region 100 and the device region 200. The material of the dielectric layer 12 can be silicon nitride, silicon oxide, borophosphosilicate glass (BPSG), phosphosilicate glass (PSG), undoped silicon glass (USG), fluorosilicate glass (FSG), spin-on glass (SOG), a low dielectric constant material with a dielectric constant lower than 4, or a combination thereof. Other devices can be included between the substrate 10 and the dielectric layer 12, for instance, a metal-oxide semiconductor device such as an N-channel field effect transistor (NMOS), a P-channel field effect transistor (PMOS), or a complementary field effect transistor (CMOS). For simplicity, the devices are not illustrated and are covered by the dielectric layer 12.

Then, referring to FIG. 1A, a portion of the first metal interconnect 60 is formed in the dielectric layer 12 of the non-device region 100 and the second metal interconnect 80 is formed in the dielectric layer 12 of the device region 200. More specifically, a portion of the first metal interconnect 60 includes the top metal layers 66 and a plurality of lower metal layers and vias below the top metal layers 66. Similarly, the second metal interconnect 80 includes the top metal layers 86 and a plurality of lower metal layers and vias below the top metal layers 86. The first metal interconnect 60 and the second metal interconnect 80 can be formed at the same time by using various known process methods. The material of each of the top metal layers 66 and 86 and the lower metal layers is, for instance, aluminum, copper or an alloy thereof. The material of the vias is, for instance, aluminum, copper, or tungsten. The linewidth W1 of at least one of the first top metal layers 66 on the non-device region 100 is greater than the linewidth W2 of one of the second top metal layers 86 on the device region 200. However, they construe no limitation in the invention. In other embodiments, the linewidth W1 of each of the first top metal layers 66 on the non-device region 100 is greater than the linewidth W2 of each of the second top metal layers 86 on the device region 200.

Then, the dielectric layer 14 is formed on the non-device region 100 and the device region 200. The material of the dielectric layer 14 can be silicon nitride, silicon oxide, BPSG, PSG, USG, FSG, SOG, a low dielectric constant material with a dielectric constant lower than 4, or a combination thereof.

Then, referring to FIG. 1B, a buffer material layer 22 is formed on the dielectric layer 14 of the non-device region 100 and the device region 200. The material of the buffer material layer 22 includes metal, metal nitride, or a combination thereof. The buffer material layer 22 is, for instance, tungsten, tantalum, tantalum/tantalum nitride/tantalum, or a combination thereof. The method of forming the buffer material layer 22 can be a physical vapor deposition (PVD) method or a chemical vapor deposition (CVD) method. The CVD is, for instance, plasma enhanced chemical vapor deposition or low pressure chemical vapor deposition and the PVD is, for instance, evaporation or sputtering. The thickness of the buffer material layer 22 can be 300 angstroms to 5000 angstroms.

Then, referring to FIG. 1B, a patterned mask layer 24 is formed on the buffer material layer 22. The patterned mask layer 24 at least covers the buffer material layer 22 on the device region 200. The patterned mask layer 24 has an opening 26 exposing the buffer material layer 22 on the non-device region 100. The patterned mask layer 24 is, for instance, a photoresist layer. The method of forming the patterned mask layer 24 includes, for instance, first forming a photoresist layer and then patterning with a photolithography process. The size of the opening 26 can be adjusted according to actual needs. In the present embodiment, only a portion of the buffer material layer 22 on the non-device region 100 is exposed, but the invention is not limited thereto.

Then, referring to FIG. 1C, an etching process is performed with the patterned mask layer 24 as an etch mask to remove the buffer material layer 22 exposed by the opening 26. The etching process can be a wet etching process or a plasma etching process. The gas used in the plasma etching process is, for instance, $CF_4$ and $NF_3$, but is not limited thereto. In the present embodiment, the remaining buffer material layer 22 is referred to as a buffer layer 22a. The buffer layer 22a covers the dielectric layer 14 of the device region 200 and a portion of the dielectric layer 14 on the non-device region 100.

Then, referring to FIG. 1D, the patterned mask layer 24 is removed. Next, a patterned mask layer 28 is formed. The patterned mask layer 28 has a plurality of openings 30 exposing the dielectric layer 14 of the non-device region 100. The patterned mask layer 28 is, for instance, a photoresist layer. The method of forming the patterned mask layer 28 includes, for instance, first forming a photoresist layer and then patterning with a photolithography process.

Then, referring to FIG. 1E, an etching process is performed with the patterned mask layer 28 as an etch mask to pattern the dielectric layer 14 of the non-device region 100 to form a plurality of via holes 32. The via holes 32 expose the first top metal layers 66. The etching process can be a wet etching process or a plasma etching process. In an embodiment, the depth of each of the via holes 32 can be 6000 angstroms to 20000 angstroms, such as 63 angstroms, but is not limited thereto.

Then, referring to FIG. 1F, the patterned mask layer 28 is removed. Next, a conductive layer 34 is formed on the non-device region 100 and the device region 200. The conductive layer 34 covers the dielectric layer 14 of the non-device region 100 and the device region 200 and is filled into the via holes 32 of the non-device region 100 to form the vias 36. The vias 36 can form another portion of the first metal interconnect 60. The material of the conductive layer 34 can be a metal or a metal alloy such as aluminum, copper, or an alloy thereof. The method of forming the conductive layer 34 can be a physical vapor deposition method such as a sputtering method. The thickness of the conductive layer 34 can be 8000 angstroms to 20000 angstroms, such as 74 angstroms, but is not limited thereto. Then, a patterned mask layer 38 is formed on the conductive layer 34. The patterned mask layer 38 covers a portion of the conductive layer 34 on the non-device region 100 and the device region 200, exposing a portion of the conductive layer 34.

Then, referring to FIGS. 1F and 1G and FIG. 2, the conductive layer 34 and the buffer layer 22 are patterned with the patterned mask layer 38 as an etch mask to form the dummy bonding pad 40, the bonding pad 42, the redistribution layer 44, and the buffer layer 22b. The dummy bonding pad 40 is on the non-device region 100 and is electrically connected to the first metal interconnect 60. The bonding pad 42 is on the device region 200. The redistribution layer 44 connects the dummy bonding pad 40 on the non-device region 100 and the bonding pad 42 on the device region 200. The buffer layer 22b is between the dummy bonding pad 40, the bonding pad 42, the redistribution layer 44, and the dielectric layer 14. Then, the patterned mask layer 38 is removed.

Next, referring to FIG. 1H, a protective layer 50 is formed on the substrate 10 to cover the dummy bonding pad 40, the bonding pad 42, and the redistribution layer 44. The protective layer 50 can be a single, double, or multi-layer structure. The material of the protective layer 50 can include silicon oxide, silicon oxynitride, silicon nitride, an organic material, a polymer or a combination thereof. The organic material is, for instance, benzocyclobutene (BCB). The polymer is, for instance, polyimide (PI). The protective layer 50 can be formed by a CVD method or a coating method. In the present embodiment, the protective layer 50 includes a silicon oxide layer 52, a silicon nitride layer 54, and a PI layer 56, and the thickness of each thereof is respectively 63 angstroms, 83 angstroms, and 83 angstroms, but the invention is not limited thereto.

Then, the protective layer 50 is patterned to form a pad window 48 in the protective layer 50. The pad window 48 exposes the surface of the bonding pad 42 on the device region 200. The remaining protective layer 50 covers the dummy bonding pad 40, the redistribution layer 44, and a portion of the bonding pad 42. The method of patterning the protective layer 50 can be a lithography process and an etching process.

Then, referring to FIG. 1I, a wire bonding process is performed to form a bonding wire 58 on the bonding pad 42. The wire bonding process can be performed by using various known methods and is not particularly limited and is therefore not repeated herein.

In the semiconductor device of the embodiments of the invention, the bonding pad is disposed on the device region, the dummy bonding pad is disposed in the non-device region, and the bonding pad is electrically connected to the dummy bonding pad through the redistribution layer to be electrically connected to the metal interconnect below the dummy bonding pad. Since the bonding pad is disposed in the device region, bonding wires do not form on the non-device region. As a result, peeling, cracks, or deformation to the dielectric layer of the non-device region due to the bonding process can be avoided. Moreover, in the embodiments of the invention, by disposing the bonding pad on the device region and disposing the buffer layer below the bonding pad, impact energy generated by bonding force can be withstood in the packaging process, thus maintaining the integrity of the original structure and avoiding the generation of cracks, peeling, or deformation, and thereby excluding the need for a thick packaging material while reducing process costs. Moreover, the material of the redistribution layer can be the same as the material of each of the dummy bonding pad and the bonding pad, and the redistribution layer, the dummy bonding pad, and the bonding pad can be formed at the same time. As a result, additional steps are not needed and other materials are not needed to form the redistribution layer, the dummy bonding pad, and the bonding pad.

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. A method of fabricating a semiconductor device, comprising:
   providing a substrate, the substrate comprising a non-device region and a device region;
   forming a dielectric layer on the non-device region and the device region;
   forming a first metal interconnect in the dielectric layer of the non-device region, wherein the first metal interconnect comprises a plurality of first top metal layers;
   forming a buffer layer on the dielectric layer of the device region, wherein the buffer layer comprises a metal, metal nitride, or a combination thereof;
   forming a conductive layer on the dielectric layer;
   patterning the conductive layer to form a dummy bonding pad, a bonding pad, and a redistribution layer, wherein the dummy bonding pad is on the non-device region and is electrically connected to the first metal interconnect, the bonding pad is on the buffer layer of the device region, and the redistribution layer connects the dummy bonding pad and the bonding pad; and
   forming a second metal interconnect in the dielectric layer below the bonding pad of the device region, wherein the second metal interconnect is not directly connected to the bonding pad, the second metal interconnect comprises a plurality of second top metal layers, a plurality of first voids are in a plurality of gaps between the first top metal layers and a plurality of second voids are in a plurality of gaps between the second top metal layers, and a number of the second voids is greater than a number of the first voids.

2. The method of claim 1, wherein a material of the buffer layer comprises tungsten, tantalum, tantalum/tantalum nitride/tantalum, or a combination thereof.

3. The method of claim 1, wherein a material of the bonding pad comprises aluminum, copper, or an alloy thereof.

4. The method of claim 1, wherein the device region comprises an array region, a core circuit region or a periphery circuit region.

5. The method of claim 4, wherein the array region comprises a switch array region, a memory array region, a logic array region, a capacitor array region, a resistor array region, or an inductor array region.

6. The method of claim 1, wherein the step of forming the first metal interconnect and the step of forming the second metal interconnect comprise:
   forming a metal layer;
   patterning the metal layer to form the plurality of first top metal layers in the non-device region and forming the plurality of second top metal layers in the device region, wherein a linewidth of each of the first top metal layers is greater than a linewidth of each of the second top metal layers;
   forming the dielectric layer on the non-device region and the device region;
   forming the buffer layer on the dielectric layer on the device region;
   patterning the dielectric layer of the non-device region to form at least a via hole to expose the corresponding first top metal layers; and
   forming the conductive layer on the dielectric layer on the non-device region and the device region, wherein the conductive layer is further filled into the at least a via hole to form at least a via.

7. The method of claim 1, further comprising forming a protective layer covering a portion of the dummy bonding pad, the redistribution layer, and a portion of the bonding pad of the non-device region, and the protective layer has a pad window exposing a surface of the bonding pad.

* * * * *